United States Patent [19]
Robinson et al.

[11] Patent Number: 4,571,818
[45] Date of Patent: Feb. 25, 1986

[54] ISOLATION PROCESS FOR HIGH-VOLTAGE SEMICONDUCTOR DEVICES

[75] Inventors: McDonald Robinson, Chester; Harry T. Weston, New Providence; Yiu H. Wong, Berkeley Heights, all of N.J.

[73] Assignee: AT&T Bell Laboratories, Murray Hill, N.J.

[21] Appl. No.: 537,057

[22] Filed: Sep. 29, 1983

[51] Int. Cl.[4] .......................................... H01L 21/76
[52] U.S. Cl. .................................. 29/576 W; 29/571; 29/580; 148/175; 148/DIG. 50; 148/DIG. 85; 357/42; 357/49
[58] Field of Search ............... 29/576 W, 576 E, 578, 29/580, 583, 577 C, 571; 357/50, 49, 55, 44, 42; 148/175, DIG. 50, DIG. 85; 156/647, 649

[56] References Cited

U.S. PATENT DOCUMENTS

| | | | |
|---|---|---|---|
| 3,895,392 | 7/1975 | Polata et al. | 357/44 |
| 3,953,255 | 4/1976 | Combs, Jr. | 148/189 |
| 4,017,341 | 4/1977 | Suzuki et al. | 148/174 |
| 4,056,413 | 11/1977 | Yoshimura | 148/175 |
| 4,393,573 | 7/1983 | Kato et al. | 29/571 |
| 4,408,386 | 10/1983 | Takagashiki et al. | 29/576 E |

OTHER PUBLICATIONS

Beasom, J. D., "A Process for Simultaneous Fabrication of Vertical NPN and DNP's, Nch and Pch MOS Devices", in 1973 *International Electron Devices Meeting Technical Digest*, Dec. 1973, pp. 41–43.

"Dielectric Isolation: Comprehensive, Current and Future," K. E. Bean et al, *Journal of the Electrochemical Society*, vol. 124, No. 1, Jan. 1977, pp. 5C–12C.

"A New Complementary Dielectric Isolation Process for High-Voltage Devices," T. Sakurai et al, *IEEE Transactions on Electron Devices*, vol. ED-28, No. 10, Oct. 1981, pp. 1199–1201.

*Primary Examiner*—Brian E. Hearn
*Assistant Examiner*—Alan E. Schiavelli
*Attorney, Agent, or Firm*—David I. Caplan

[57] ABSTRACT

A semiconductor structure including a pair of single-crystal semiconductor bulk regions (10.3, 12.2) of differing first and second bulk conductivities, respectively, for forming semiconductor circuits therein, is fabricated whereby each such region is electrically isolated from the other and from a rigid body (20) supporting these regions. The structure is formed by forming at a major surface of a single crystal semiconductor wafer (10) having the first bulk conductivity a bulk zone (12.1) having the second bulk conductivity, followed by the steps of (1) forming in the wafer (10) at the major surface (10.6) thereof a V-shaped groove (10.2) at the boundary of the bulk zone (12.1) using a crystallographic orientation dependent etch, in order to define the regions (10.3, 12.2) of differing conductivities, (2) forming a dielectric layer (15.1, 15.2) upon the walls of the V-groove and upon the exposed portion of the major surface, (3) forming a rigid body layer (20), such as polysilicon, upon the dielectric layer (15.1, 15.2), and (4) planarizing the exposed, opposed major surface of the single crystal medium down to the vertices of the V-grooves. The semiconductor circuits themselves can then be fabricated in the resulting mutually dielectrically isolated regions (10.3, 12.2).

13 Claims, 23 Drawing Figures

ISOLATION PROCESS FOR HIGH-VOLTAGE SEMICONDUCTOR DEVICES

FIELD OF THE INVENTION

This invention relates to semiconductor apparatus and, more particularly, to methods for fabricating a plurality of individual semiconductor regions that are mutually electrically isolated in a single semiconductor body and the product of such methods.

BACKGROUND OF THE INVENTION

In a variety of transistor circuit applications—such as flat panel displays and time division multiplexed electronic telephone exchange equipment—complementary bipolar transistor devices are desirable that (1) are capable of handling high voltages (typically about 90 volt or more), (2) are integrated in separate single crystal silicon semiconductor regions of opposite bulk conductivity type, and (3) are mutually electrically isolated from one another by insulating dielectric isolation layers. These dielectric isolation layers have important advantages over pn junction isolation—such as enabling an overall more compact structure and hence a desirably greater device packing density, as well as resisting degradation of the electrical isolation caused by electron-hole pairs, including those pairs which are generated by external ionizing radiation. Other advantages of dielectric isolation over junction isolation include: (1) it eliminates unwanted latch-up action that could otherwise occur among pnpn structures inherently associated with the impurity diffusions of neighboring junction isolated devices, and (2) the dielectric isolation layer reduces the parasitic capacitances between the devices and the supporting substrate, as well as between the devices themselves, thereby enabling higher speed circuit operation.

In a variety of other circuit applications—such as circuits having a portion with high voltage handling capability for power switching and a low voltage portion (typically about 5 volts or less) for control circuitry—one or more high voltage handling transistors are desirable that are integrated in a single crystal silicon semiconductor region having a different uniform bulk conductivity or different bulk thickness (or both) from that of a separate single crystal silicon semiconductor region, the two regions being mutually electrically isolated from each other by insulating dielectric isolation layers.

K. E. Bean et al, in a paper entitled "Dielectric Isolation: Comprehensive, Current and Future," published in *Journal of the Electrochemical Society: Reviews and News*, Vol. 124, pp. 5C–12C (1977), describe a process for producing dielectrically isolated silicon crystal regions. All such regions, however, have the same uniform n type or p type conductivity as that of the original silicon body. Because of this resulting sameness of the conductivity of all regions, this process does not provide either the regions of the differing type of bulk conductivity desired for complementary bipolar transistor devices or the regions of differing magnitudes of bulk conductivity, or of different bulk thicknesses, as is desired for high voltage power switching circuitry combined with low voltage control circuitry.

In U.S. Pat. No. 4,393,573 entitled "Method of Manufacturing Semiconductor Device Provided With Complementary Semiconductor Elements," issued on July 19, 1983 to Kato et al, a process is described for making complementary high voltage devices with dielectric isolation. The process, however, involves the growth of epitaxial silicon upon a major surface of a silicon body both at a time when portions of the surface are coated with a masking layer of silicon nitride and/or silicon dioxide and at a time when portions of the surface are coated with portions of a layer of the dielectric isolation. Consequently the crystalline quality of the epitaxial silicon is not as high as needed for desirable performance of the transistor devices which are subsequently fabricated therein. It would therefore be desirable to have a process for forming dielectrically isolated semiconductor regions of differing properties (bulk conductivity type and/or magnitude, and/or bulk thickness) which mitigates the shortcomings of prior art.

SUMMARY OF THE INVENTION

This invention involves a process for forming dielectrically isolated single crystal semiconductor bulk regions, all of high crystalline quality, at least one of the regions having a bulk conductivity which is different in magnitude or type (or both) from that of another of the regions. In addition, one of the regions can have a different thickness from that of another.

In accordance with the invention, dielectrically isolated semiconductor bulk regions of differing bulk conductivities, respectively, are fabricated by a process comprising: (a) forming in a single-crystal semiconductor wafer initially having one bulk conductivity at least one region of a different bulk conductivity including the steps of forming at least one depression in a major planar surface located on one side of the wafer and growing an epitaxial layer of the different bulk conductivity upon the surface of the one side of the wafer including the surface of the depression at a time when the semiconductor on one side, including the depression, is everywhere exposed; (b) forming a groove in the wafer at a boundary of said one region after performing said steps; and (c) forming an insulating layer upon a then exposed surface of said one region.

In accordance with a specific embodiment of the invention, electrically isolated first and second semiconductor bulk regions of differing first and second conductivities, respectively, are formed by:

(a) forming at least one region of the second bulk conductivity in a single-crystal semiconductor wafer initially having the first bulk conductivity, by the steps of (1) forming in the wafer, at a selected portion of the major surface, at least one depression therein; (2) growing an epitaxial layer of second, different bulk conductivity upon the major surface, as well as upon the surface of the depression; (3) planarizing the epitaxial layer to expose the original semiconductor wafer at a portion thereof complementary to the selected portion, whereby the remaining region of the epitaxial layer forms the second bulk region;

(b) forming one or more grooves in the major surface of the wafer at a boundary between the first and second regions; and (c) forming an insulating layer at least upon the surface of the grooves.

Mechanical support for the bulk regions is supplied by a rigid body firmly attached to the insulating layer. Physical exposure of the regions—for access thereto, in order to fabricate the desired circuit elements therein—can be obtained by planarizing the opposed major surface of the semiconductor wafer.

BRIEF DESCRIPTION OF THE DRAWING

This invention together with its advantages, features, and objects can be better understood from the following detailed description when read in conjunction with the drawings in which.

Only for the sake of clarity, none of the drawings is to scale.

DETAILED DESCRIPTION

Figure 1:
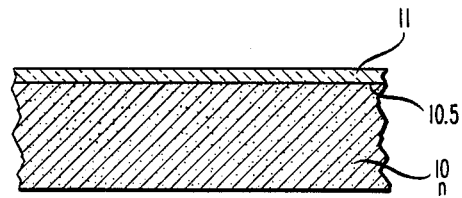
FIGS. 1-10 are cross-section views of dielectrically isolated semiconductor devices during various stages of fabrication in accordance with a specific embodiment of the invention.
Figure 2:
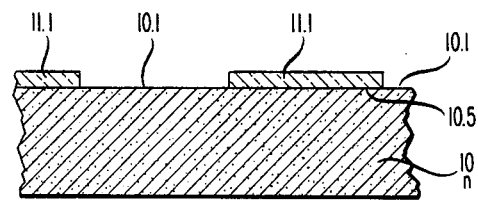
Figure 3:
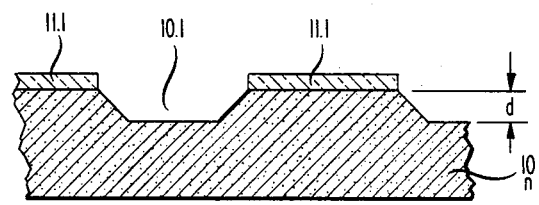

As shown in FIG. 1, a semiconductor wafer 10 of uniform bulk conductivity is initially prepared with a top planar surface 10.5, preferably the (100) crystallographic plane, and a protective masking layer 11. Illustratively, the wafer 10 is n type silicon semiconductor of uniform bulk conductivity, and the masking layer 11 is a silicon dioxide layer having a thickness of typically about 0.5 micron, as formed by thermal oxidation for example. The masking layer is patterned, as by standard photolithographic masking and etching, to form a patterned protective mask 11.1 (FIG. 2), whereby selected portions 10.1 of the major surface 10.5 are exposed. The top surface of the structure being fabricated is then subjected to an etching step which removes silicon at the selected portions 10.1 to form depressions thereat to a predetermined depth d (FIG. 3). For example, this etching can be anisotropic wet etching with a suitable mixture of potassium hydroxide, N-propyl alcohol, and water at about 80 degrees C. to a depth d in the range of about 10 to 100 micron.

Next (FIG. 4) the patterned mask 11.1 is removed, and an epitaxial layer 12 of uniform bulk conductivity is grown all over the top (nonplanar) surface of the wafer 10. Illustratively, this epitaxial layer 12 is p type silicon having a uniform bulk conductivity and having a thickness equal to at least the depth d. Then (FIG. 5) the top surface of the structure being fabricated is substantially planarized—as by grinding, lapping, and polishing—to a depth sufficient to form separate p type semiconductor zones 12.1, separated from one another by n type semiconductor bulk regions 10.3 stemming from the wafer 10 and extending to the top major surface 10.6 of the structure.

Next (FIG. 6) another patterned protective masking layer 13.1 is formed, and again the top surface of the structure being fabricated is anisotropically etched, by a crystallographic orientation dependent etch process, to form V-shaped grooves 10.2 at the top surface of the semiconductor wafer 10 at the boundary of the p type semiconductor zones 12.1. Illustratively, the patterned masking layer 13.1 is silicon dioxide, and the etching is done with the above mixture of potassium hydroxide, alcohol, and water at 80 degrees C. The width of the apertures in the masking layer 13.1 determines the width w of the top of the V-grooves 10.2, which is advantageously sufficient for the apex of the V-grooves to penetrate to a level beneath the horizontal level of the bottom of the zones 12.1, whereby p type bulk regions 12.2 are formed, and whereby n type bulk regions 10.3 of the wafer 10 extend to the top surface of the semiconductor medium 10 where the p type regions 12.2 are absent.

Figure 7:
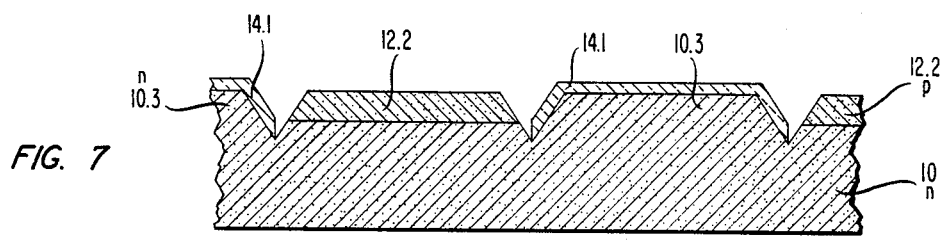

Next (FIG. 7) the masking layer 13.1 is removed and a patterned protective masking layer 14.1 is formed selectively, that is, covering only the then exposed top surface of the n type wafer 10 but not covering any part of the p type semiconductor regions 12.2. This protective layer 14.1 illustratively is silicon nitride as deposited by low pressure chemical vapor deposition and as patterned with the inorganic photoresist system Ag-Se/Ge-Se, for example, as described in U.S. Pat. No. 4,276,368, issued to A. Heller on June 30, 1981, entitled "Photoinduced Migration of Silver into Chalcogenide Layer," which is capable of nonplanar lithography, as discovered by E. Ong and Y. H. Wong (one of the inventors herein) and to be disclosed in an application to be filed by them. Next an impurity is implanted, such as boron and/or other Column III element suitable for a wrap-around p+ layer 12.3 for the p type regions 12.2. This wrap-around layer can also be of any desired conductivity magnitude or type.

Figure 8:
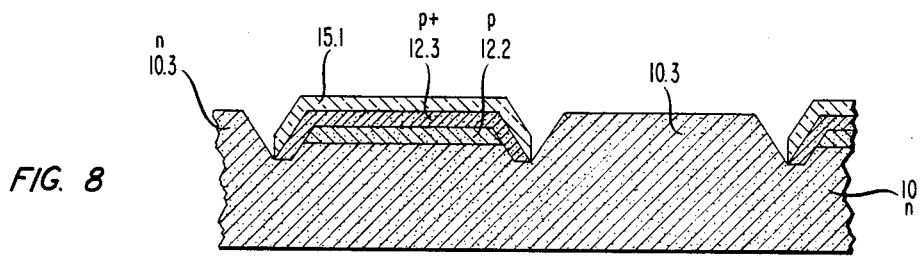

Then the top surface of the structure is oxidized to grow a protective dielectric silicon dioxide masking layer 15.1 upon the then exposed p+ type silicon regions 12.3 but not upon the silicon nitride layer 14.1. Next (FIG. 8) the silicon nitride layer 14.1 is removed, as by treatment with hot phosphoric acid, whereby the silicon dioxide layer 15.1 acting as a masking layer remains intact.

Figure 9:
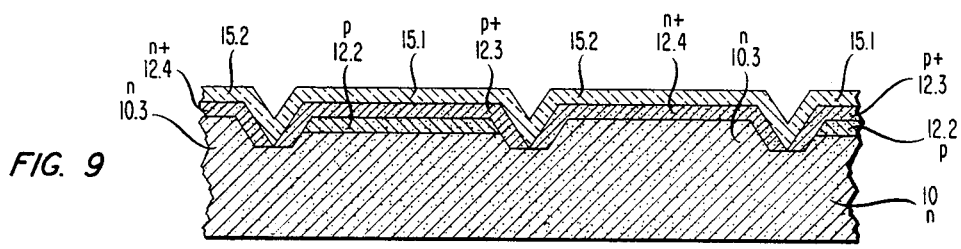
Figure 10:
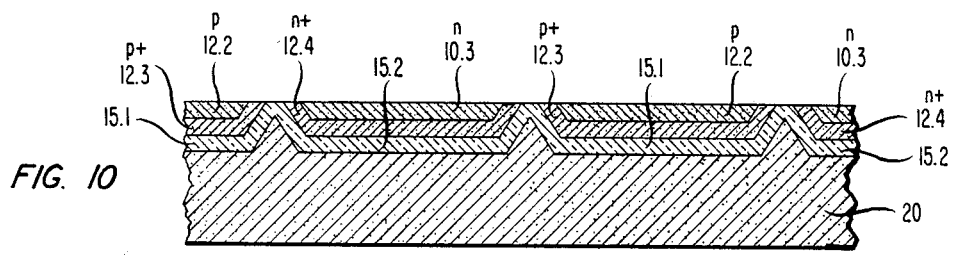
Figure 11:
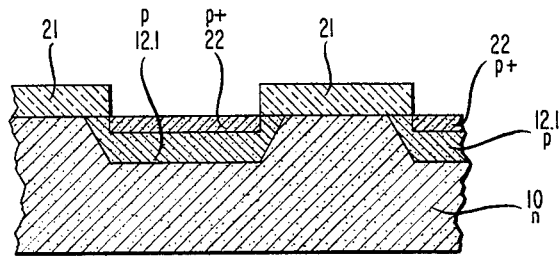
FIGS. 11-17 are cross-section views of dielectrically isolated semiconductor devices during various stages of fabrication in accordance with another specific embodiment of the invention.
Figure 12:
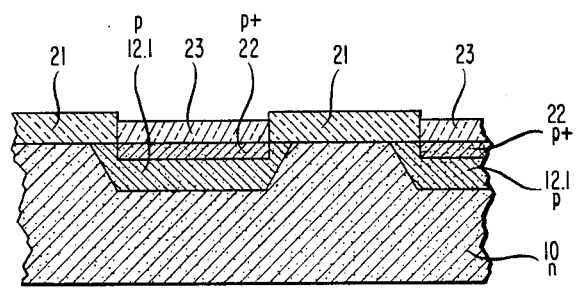
Figure 13:
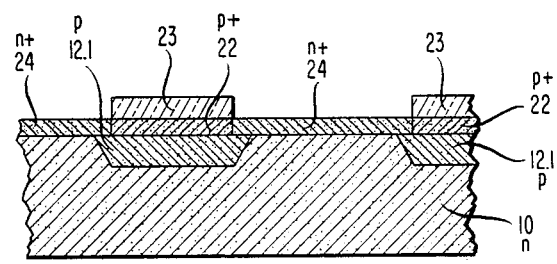
Figure 14:
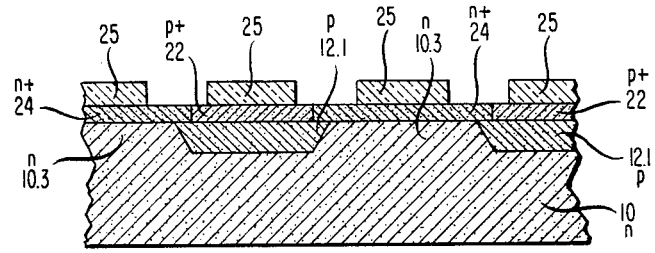
Figure 15:
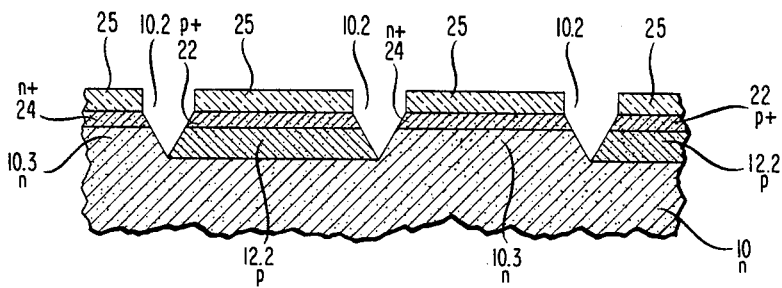

Next (FIG. 9) another impurity is implanted, such as arsenic and/or phosphorus or other Column V element suitable for a wrap-around n+ layer 12.4 for the n type bulk regions 10.3 of the wafer 10 at the top surface thereof. This wrap-around layer can be of any desired conductivity magnitude or type. Again the top surface is oxidized to grow a silicon dioxide dielectric insulating layer 15.2 upon the n type region at the top surface of the wafer 10 and at the same time increasing the thickness of the dielectric insulating layer 15.1. In any event, the entire top surface of the structure is then coated with dielectric insulating silicon dioxide layer 15.1 plus the dielectric insulating silicon dioxide layer 15.2. Then a polycrystalline silicon layer 20 is deposited typically by chemical vapor deposition, the top surface of the polycrystalline silicon layer is planarized, and then the structure is turned upside down, whereupon the then single crystal top surface is planarized (FIG. 10) at least down to the vertex of each V-groove. This planarization thus removes the single crystal silicon of the original wafer 10 except for the thus separated n type regions 10.3 and the p type regions 12.2. Standard grinding, lapping, and polishing techniques can be used to planarize the structure being fabricated. Thus the structure now contains n type regions 10.3 which are insulated from p type regions 12.2 and from the polysilicon layer 20 by the dielectric isolation furnished by the silicon dioxide insulating layers 15.2 and 15.1. The p type regions 12.2 are surrounded completely (except at the exposed top surface) by the p+ wrap-around layers 12.3; the n type regions 10.3, by the n+ wrap-around layers 12.4. As known in the art, complementary bipolar or MOS (or both) transistor devices can then be fabricated in these regions, utilizing the wrap-around layers 12.3 and 12.4 for good electrical access to the transistor devices as is desirable in many circuit applications.

For certain circuit applications, such as N-MOS control circuits together with power circuits, instead of the p type regions 12.2, one or more n type regions are desired which have a lower bulk conductivity than that of the n type bulk region(s) 10.3, i.e., that of the n type wafer 10. In such a case, instead of growing the epitaxial layer 12 as p type, one would grow this epitaxial layer as n type having a lower bulk conductivity than that of the wafer 10.

For certain other circuit applications, complete wrap-around layers 12.3 and 12.4 are not necessary or desired. Although these complete wrap-around layers are easily electrically accessible from the top surface, the tips of these wrap-around layers can cause electrical problems in cases where there is a high voltage potential between these tips and an overlying metallization interconnection; and these wrap-around layers can consume an undue amount of space at the top surface, thereby undesirably reducing the remaining lateral space available for transistor devices. Some of this space can be saved by limiting the lateral extent of the wrap-around layer particularly on the V-groove surfaces to less than the full width of the bulk region, to form "limited wrap-around" layers, as can be achieved by correspondingly limiting the width of the p+ and/or n+ implantation as defined by an extension of the mask formed by the protective layer 14.1 and/or 15.1 extending over a corresponding complementary portion of the bulk region 12.2 and/or 10.3, respectively. On the other hand, in some cases, it is not necessary to electrically access directly the wrap-around layer. In those cases, therefore, instead of wrap-around n+ and p+ layers, completely buried planar n+ or p+ layers are useful. Moreover, in still other cases, no wrap-around layer of any kind may be needed.

Figure 16:
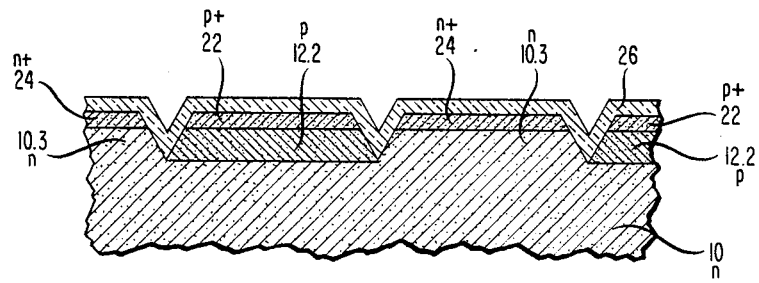
Figure 17:
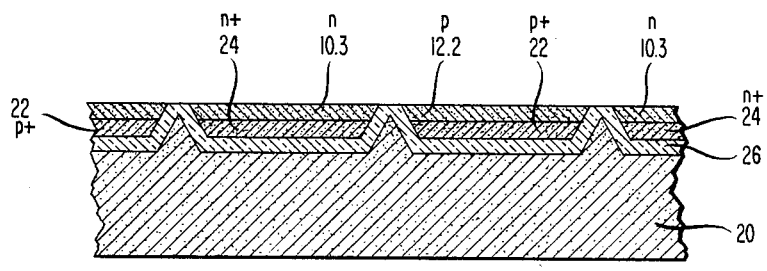

In order to fabricate structures with planar buried layers, the starting point is the same as shown in FIGS. 1–5, and the remaining steps are indicated in FIGS. 11–17. More specifically, a protective masking layer 21 (FIG. 11), such as silicon nitride, is formed on the top surface of the structure being fabricated, and a p+ layer 22 is formed at the top surface of the p region 12.1, as by standard ion implantation. Next another protective masking layer 23 (FIG. 12) is formed, as by thermal growth of silicon dioxide. The masking layer 21 is then removed, but the masking layer 23 is allowed to remain intact (FIG. 13), and an n+ layer 24 is formed at the top of bulk regions 10.3 of the wafer 10 that are then not covered by the masking layer 23. Depending upon the resulting relative impurity concentrations in the p+ layer 22 and the n+ layer 24, the n+ layer 24 may or may not run over into regions overlying the edges of the p regions 12.1, but these edge portions of the p+ layer 22 will be removed in the subsequent V-groove etching step. Next the masking layer 23 is removed, and a new masking layer 25 is formed (FIG. 14) so as to coat the top surface of the structure in regions thereof overlying the central portions of both the p+ layers 22 and the n+ layers 24. Then an anisotropic etching is done (FIG. 15) to form the V-grooves 10.2 which separate the p type regions 12.2 from the n type surface regions 10.3. Next the masking layer 25 is removed and a dielectric isolation layer 26 is formed, such as silicon dioxide by thermal growth, all over the top surface of the structure (FIG. 16). Finally the polysilicon layer 20 is deposited over this dielectric isolation layer 26, the polysilicon layer is planarized, and then the structure is turned upside down and the single crystal 10 is thinned down, at least as far down as the vertices of the dielectric layer 26 (FIG. 17), in order to form the desired structure having complementary n and p bulk regions 10.3 and 12.2, respectively, with buried n+ and p+ layers 24 and 22, respectively, in a structure having a planar top surface. Accordingly, complementary bipolar or MOS transistors or both can then be fabricated in the n and p regions 10.3 and 12.2, as known in the art.

One or more bulk regions 12.2 can be made to be n type instead of p type, but of a bulk conductivity which is different from, typically lower than, that of the n type bulk regions 10.3 simply by growing the epitaxial layer 12 as n type but of different bulk conductivity magnitude from that of the wafer 10. Moreover, in certain circuit applications, the wrap-around or buried layer can be omitted.

Figure 4:
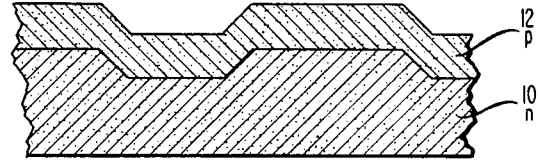
Figure 5:
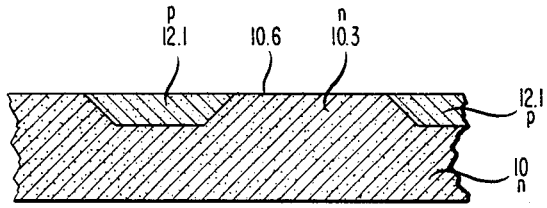
Figure 6:
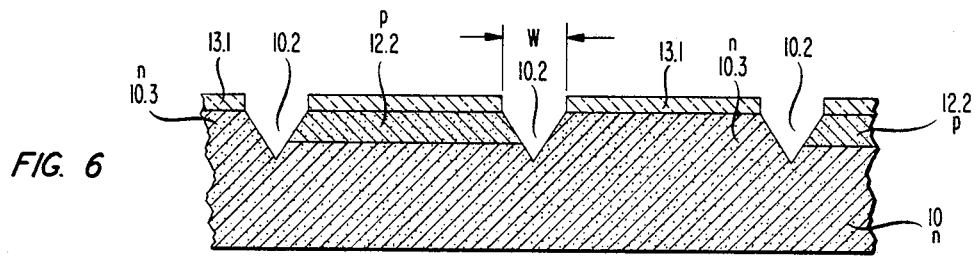
Figure 18:
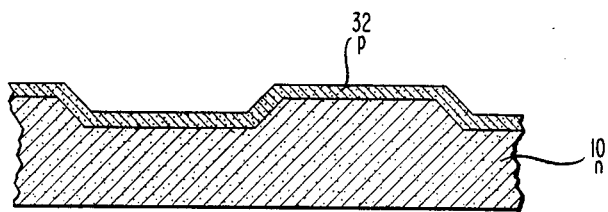
FIGS. 18-20 are cross-section views of dielectrically isolated semiconductor devices during various stages of fabrication in accordance with yet another specific embodiment of the invention.
Figure 19:
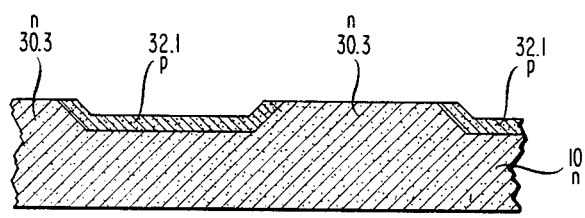
Figure 20:
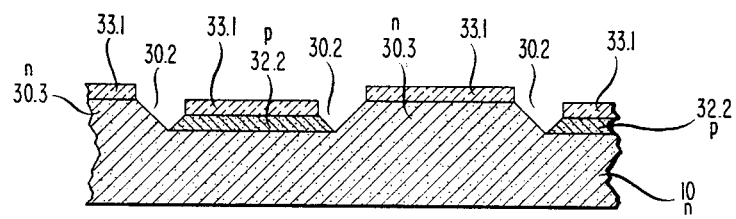

In still other circuit applications it is further desirable that the thickness of the bulk n region be greater than the thickness of the bulk p region, as, for example, where the bulk n region supports high voltage power circuits and the bulk p region supports low voltage logic circuits. Accordingly, in order to fabricate structures with this property, the starting point is the same as previously described in connection with FIGS. 1–3, and the succeeding steps are indicated in FIGS. 18–20 to be followed by steps as previously described in connection with FIGS. 7–10 or alternatively FIGS. 11–17. Elements in FIGS. 18–20 which are similar to those of FIGS. 4–6 are denoted by the same reference numerals plus twenty. More specifically the epitaxial p type semiconductor layer 32 (FIG. 18) on the wafer 10 is grown to a thickness which is less than the depth of the depressions. Then (FIG. 19) the top surface of the structure being fabricated is substantially planarized—as by grinding, lapping, and polishing—to a depth sufficient to form separate p type semiconductor zones 32.1, separated from one another by n type bulk region 30.3. Next a patterned protective layer 33.1 (FIG. 20) is formed upon the bulk regions 30.3 and 32.1 for the purpose of the subsequent nonplanar V-groove etching of the groove 30.2 by anisotropic wet etching, for example. Such etching leaves p type individual bulk region 32.2 remaining at the top surface. Then the stages indicated in FIGS. 7–10, as previously described, can be performed; or alternatively the steps 11–17 can then be performed.

Figure 21:
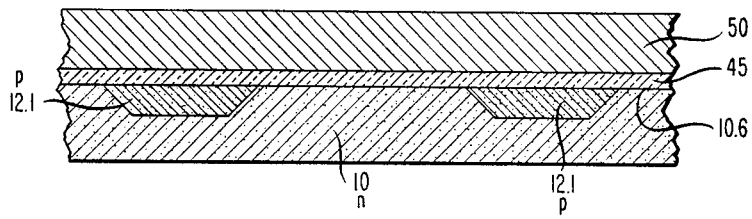
FIGS. 21-23 are cross-section views of dielectrically isolated semiconductor devices during various stages of fabrication in accordance with yet another specific embodiment of the invention.
Figure 22:
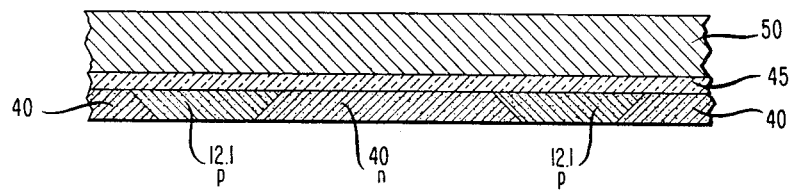
Figure 23:
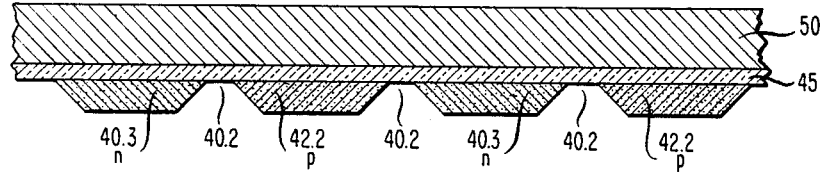

In yet another embodiment, instead of a polycrystalline layer as the rigid body layer supporting the bulk n and p regions, single crystal silicon or quartz can be used. Fabrication steps in accordance with this embodiment start with those previously described in connection with FIGS. 1–5 and then proceed as depicted in FIGS. 21–23. Elements in FIGS. 21–23 that are similar to those in FIGS. 6–10 are denoted by the same reference numerals plus thirty. More specifically, the top major surface 10.6 is coated with a thermally grown silicon dioxide dielectric insulating layer 45 (FIG. 21), and the rigid body 50 is bonded thereto. For example, pressure assisted or electric field assisted bonding can be used. For instance, with an electric field of typically about 10 volt/micron in the oxide or at the pressure of typically about 0.025 psi (gauge) and at a temperature of typically about 1100 degrees C., a slice of single crystal silicon, polycrystalline silicon, or quartz is bonded to the dielectric isolation layer 45. Electric field assisted bonding is illustratively described in greater detail in the patent application filed by Frye et al on Jan. 20, 1983, Serial No. 460,399, entitled "Dielectrically Isolated Semiconductor Devices." Then (FIG. 22) the bottom surface of the silicon wafer 10 is planarized sufficiently to expose the p type epitaxial bulk region 12.1, whereby n type bulk regions 40 of the original wafer 10 intervene between neighboring p type regions 12.1. Finally (FIG. 23), V-grooves 40.2 are etched at the boundaries between neighboring n type and p type bulk regions to form isolated n type bulk regions 40.3 and p type bulk regions 42.2. The walls of the V-grooves can then be oxidized for device passivation purposes and integrated circuits built into the exposed bottom surfaces of these bulk regions.

Although the invention has been described in terms of specific embodiments, various modifications can be made without departing from the scope of the invention. For example, the grooves can have other contours than those of a V-shaped groove, so long as such grooves are deep enough to enable the required structure of dielectrically isolated semiconductor regions.

What is claimed is:

1. In a process of forming dielectrically isolated first and second semiconductor bulk regions of differing first and second bulk conductivities, respectively, the steps of:
    (a) forming at least one region of the second bulk conductivity in a single-crystal semiconductor wafer initially having the first bulk conductivity, including the steps of (1) forming at least one depression in a major planar surface of the wafer located on one side thereof, (2) growing an epitaxial layer of the second bulk conductivity all over the surface of the one side of the wafer including the surface of the depression at a time when said one side including the depression substantially everywhere has semiconductor of the first bulk conductivity exposed, and (3) planarizing the surface of the epitaxial layer sufficiently to expose the first bulk conductivity at areas which are complementary to the depression;
    (b) forming a groove in the wafer at a boundary of said one region after performing said steps;
    (c) implanting first impurity ions at an exposed portion of surface of the first region to form a wrap-around or a limited wrap-around layer thereat of higher conductivity then the first bulk conductivity, said exposed portion of surface including a portion and only a portion of the surface of the groove; and
    (d) forming an insulating layer upon an exposed surface of at least said first region.

2. The process of claim 1 in which the groove is formed by anisotropic etching of said one side of the wafer.

3. In a process of forming dielectrically isolated first and second semiconductor bulk regions of differing first and second bulk conductivities, respectively, the steps of:
    (a) forming at least one region of the second bulk conductivity in a single-crystal semiconductor wafer initially having the first bulk conductivity, by the steps comprising: (1) forming in the wafer, at a selected portion of a major surface thereof, at least one depression therein; (2) growing an epitaxial layer of the second bulk conductivity everywhere upon the major surface of first bulk conductivity, as well as upon the surface of the depression of first bulk conductivity, at a time when the semiconductor at the major surface and the semiconductor at the surface of the depression have the first bulk conductivity; (3) planarizing the epitaxial layer to expose the original semiconductor wafer at a portion thereof complementary to the selected portion, whereby the remaining region of the epitaxial layer forms the second bulk region;
    (b) forming one or more grooves in a major surface of the wafer at a boundary between the first and second regions;
    (c) implanting first impurity ions at an exposed portion of surface of the first region to form a wrap-around or a limited wrap-around layer thereat of higher conductivity than the first bulk conductivity; and
    (d) implanting second impurity ions at an exposed surface of the second region to form a second wrap-around or limited wrap-around layer thereat of higher conductivity than the second bulk conductivity.

4. The steps of claim 3 followed by the step of forming an insulating layer at least upon the surface of the grooves.

5. In the process of claim 4 the further step of forming another insulating layer upon exposed surfaces of the first and second bulk regions.

6. In the process of claim 5 the further step of affixing a rigid body to said another insulating layer.

7. A method for making a rigid body layer supporting first and second single crystal semiconductor regions, which are electrically insulated from each other and from the body by a dielectric isolation layer and which have differing first and second essentially uniform bulk conductivities, comprising the steps of:
    (a) forming substantially everywhere upon a major surface of a single crystal semiconductor wafer medium having the first bulk conductivity an epitaxially grown zone having the second bulk conductivity by etching the major surface of the wafer medium at a selected portion thereof to form a depression therein where the zone is to be formed, followed by growing an epitaxial layer, having the second bulk conductivity, substantially everywhere upon the major surface, including the then exposed surface of the depression at a time when the major surface, including the then exposed surface of the depression, everywhere has semiconductor of the first bulk conductivity exposed, and planarizing the epitaxial layer to expose a first bulk conductivity portion of the major surface which is complementary to the selected portion thereof;
    (b) forming at the major surface a groove in the medium in a neighborhood including the boundary of the zone, in order to define the first and second regions, the groove having a vertex portion;
    (c) implanting first impurity ions at an exposed portion of the first region, said exposed portion including a portion and only a portion of the surface of the groove, to form a layer at the surface thereof having a higher conductivity than the first bulk conductivity;
    (d) forming an insulating dielectric layer upon the then exposed major surface including upon the then exposed surfaces of the groove;

(e) forming the rigid body layer upon the dielectric layer; and (f) planarizing a second, opposed major surface of the single crystal semiconductor wafer to remove the single crystal to a distance sufficient to expose a vertex portion of the groove, whereby the first and second regions are mutually electrically insulated from each other and from the rigid body layer by the dielectric layer.

8. The method of claim 7 in which the single crystal wafer is essentially silicon.

9. The method of claim 8 in which the rigid body layer is essentially polycrystalline silicon.

10. The method of claim 7 in which the rigid body layer is essentially polycrystalline silicon.

11. The method of claim 7 in which the first bulk conductivity is opposite to that of the second.

12. The method of claim 7 further comprising the step of implanting second impurity ions after the step (c) and before the step (d) at an exposed portion of the surface of the second region to form a layer at the surface thereof having a higher conductivity than the second bulk conductivity.

13. The method of claim 11 further comprising the step of implanting second impurity ions after step (c) and before step (d) at an exposed portion of the surface of the second region to form a layer at the surface thereof having a higher conductivity than the second bulk conductivity.

* * * * *